United States Patent [19]

Roney et al.

[11] Patent Number: 5,528,474
[45] Date of Patent: Jun. 18, 1996

[54] LED ARRAY VEHICLE LAMP

[75] Inventors: Troy L. Roney, Madison; Bruce S. Rigsby, Charlestown, both of Ind.

[73] Assignee: Grote Industries, Inc., Madison, Ind.

[21] Appl. No.: 276,199

[22] Filed: Jul. 18, 1994

[51] Int. Cl.[6] .................................................. F21V 29/00
[52] U.S. Cl. ........................ 362/249; 362/294; 362/373; 362/800; 362/61; 264/272.13
[58] Field of Search ..................................... 362/249, 800, 362/240, 235, 252, 61, 294, 373, 80.1, 80, 83.3; 264/1.7, 272.16, 272.13, 272.11

[56] References Cited

U.S. PATENT DOCUMENTS

| | | | |
|---|---|---|---|
| 4,271,408 | 6/1981 | Teshima et al. | 340/702 |
| 4,632,798 | 12/1986 | Eickman et al. | 264/272.17 |
| 4,654,629 | 3/1987 | Bezos et al. | 340/87 |
| 4,729,076 | 3/1988 | Masami et al. | 362/235 |
| 4,733,335 | 3/1988 | Serizawa et al. | 362/80 |
| 4,774,434 | 9/1988 | Bennion | 313/511 |
| 4,826,896 | 5/1989 | Proctor | 264/272.13 X |
| 4,929,866 | 5/1990 | Murata et al. | 313/500 |
| 4,935,665 | 6/1990 | Murata | 313/500 |
| 4,951,179 | 8/1990 | Machida | 362/61 |
| 5,038,255 | 8/1991 | Nishihashi et al. | 362/61 |
| 5,062,027 | 11/1991 | Machida et al. | 362/800 X |
| 5,162,696 | 11/1992 | Goodrich | 362/800 X |
| 5,241,457 | 8/1993 | Sasagima et al. | 362/800 X |
| 5,268,828 | 12/1993 | Miura | 362/800 X |
| 5,278,432 | 1/1994 | Ignatius et al. | 362/800 X |
| 5,278,731 | 1/1994 | Davenport et al. | 362/32 |
| 5,313,729 | 5/1994 | Sakai et al. | 362/240 X |
| 5,345,705 | 9/1994 | Lawrence | 362/800 X |

*Primary Examiner*—Denise L. Gromada
*Assistant Examiner*—Thomas M. Sember
*Attorney, Agent, or Firm*—Woodard Emhardt Naughton Moriarty & McNett

[57] ABSTRACT

A lamp, such as for truck trailers and/or tractors, is provided with LEDs mounted to a circuit board placed in a housing. The LEDs and circuit boards are fully embedded in a resin material cured with thermally conductive particles suspended therein for conducting excess heat to the outer aluminum housing and the outer environment. The lens cover has a series of parallel, elongated lens ribs providing constant optics while allowing additional LEDs to be positioned in a row behind a lens rib. The LED circuit board has large traces to enhance heat dissipation.

25 Claims, 4 Drawing Sheets

LED ARRAY VEHICLE LAMP

BACKGROUND OF INVENTION

The present invention relates generally to lamps, and more specifically to vehicle lamps having an array of light emitting diodes (LEDs) requiring heat dissipation.

Certain light sources, including LEDs, are useful in lamps, such as for passenger cars, high mount stop lamps, clearance/marker lamps, as well as heavy duty tractor and trailer lamps. Lamps may be used as combination brake, turn and tail lamps for heavy duty trucks and trailers. Ordinarily, however, for LED lamps this requires the use of multiple LEDs in order to satisfy the Federal Motor Vehicle Safety Standard (FMVSS) 108 lighting requirements. Moreover, such lamps must illuminate seventy-five (75) square centimeters of lens area to provide proper visibility. When LEDs are tightly spaced in an array, the junction temperature of the LEDs can significantly reduce the light output below legal requirements when the lamp is energized for an extended period of time.

While other lamps have attempted to use heat sinks to address this problem, the present invention provides excellent heat conductivity solutions to this problem while also providing other advantages.

SUMMARY OF THE INVENTION

According to one embodiment, the present invention provides a lamp assembly, comprising: a housing; a light transmissive window member on the housing, forming a space therein; and at least one light emitting unit mounted to a front face of a circuit board member located within the space. The light emitting unit also emits heat.

A formable thermally conductive medium is located within the space, with a matrix having a first coefficient of thermal conductivity and a suspended material comprising heat conductive particles suspended in the matrix. The particles have a second coefficient of thermal conductivity which is higher than the first coefficient of thermal conductivity to conduct heat emitted from the light emitting unit out of the lamp assembly.

The circuit board member is substantially fully embedded in the formable thermally conductive medium having the formable matrix material formed in contact with the light emitting unit and formed in contact with the circuit board.

The present invention also provides a lamp assembly, comprising: a housing; a light transmissive window member, and on said housing, wherein said housing and said window member form a space therein; and, a row of light emitting units.

An elongated lens rib is provided along said window member running along and in front of said row of light emitting units. The lens rib has a curvature when viewed in cross-section which remains generally constant along at least portions of the lens rib to allow selective positioning of the light emitting units at various locations along the elongated lens rib with substantially constant optics by the elongated lens rib.

The present invention also provides a method for making a lamp assembly, comprising the steps of: providing a housing; positioning a circuit board having a plurality of light emitting diodes in the housing; filling at least a portion of the housing with an initially liquid material in contact with the circuit board; solidifying the initially liquid material into a solid material having said circuit board embedded therein; and, placing a light transmissive window member onto the housing and over the light emitting diodes.

One object of the present invention is to provide an improved lamp. Another object is to dissipate heat from a lamp. These and other objects are apparent from the background and the following disclosure.

DESCRIPTION OF THE PREFERRED EMBODIMENT

Figure 1:
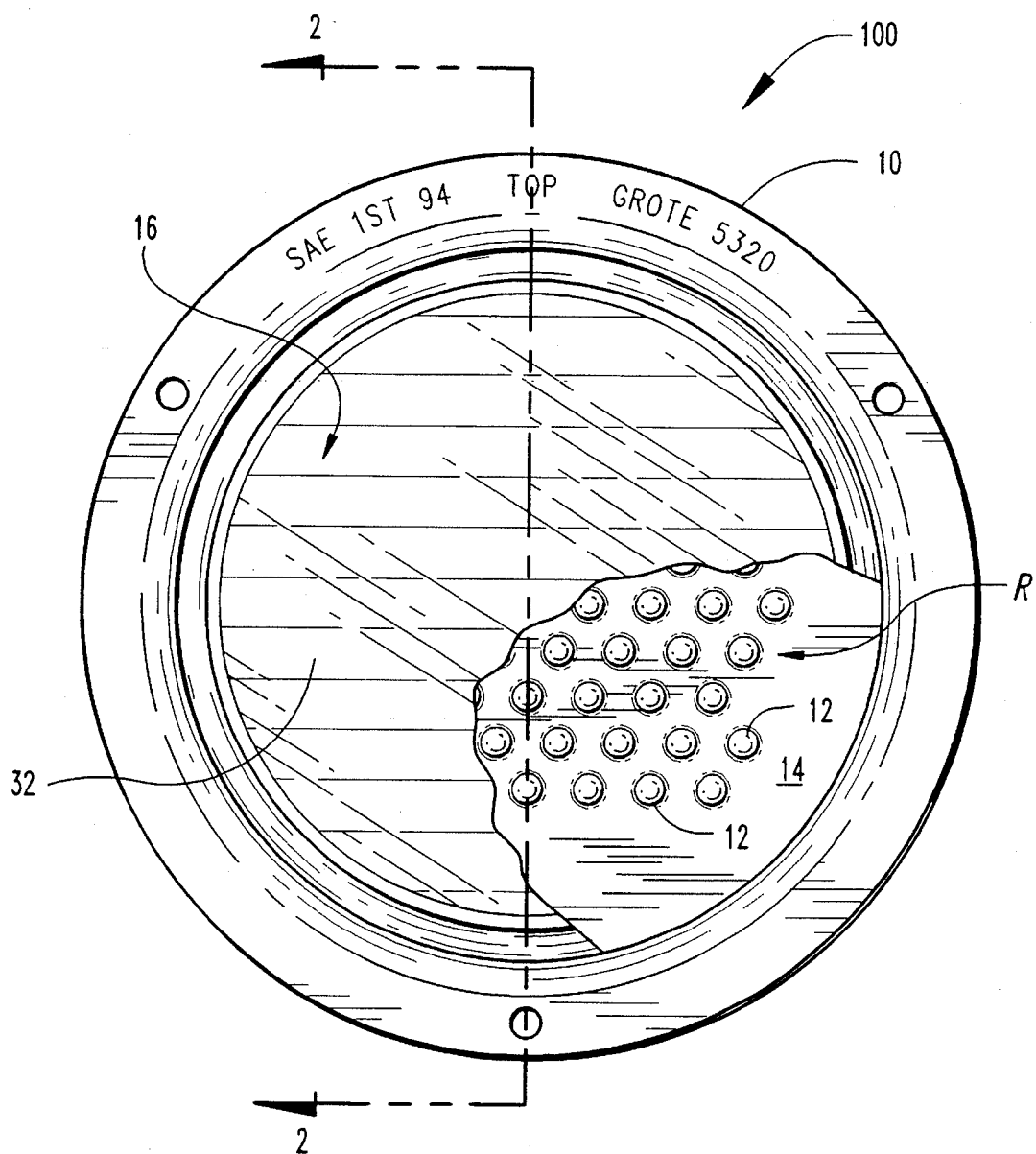
FIG. 1 is a front view of the lamp assembly of one version of the present invention showing the lens partially cut away to expose interior portions of the lamp.

For the purposes of promoting an understanding of the principles of the invention, reference will now be made to the embodiment illustrated in the drawings and specific language will be used to describe the same. It will nevertheless be understood that no limitation of the scope of the invention is thereby intended, such alterations and further modifications in the illustrated device and method, and such further applications of the principles of the invention as illustrated therein being contemplated as would normally occur to one skilled in the art to which the invention relates.

Figure 2:
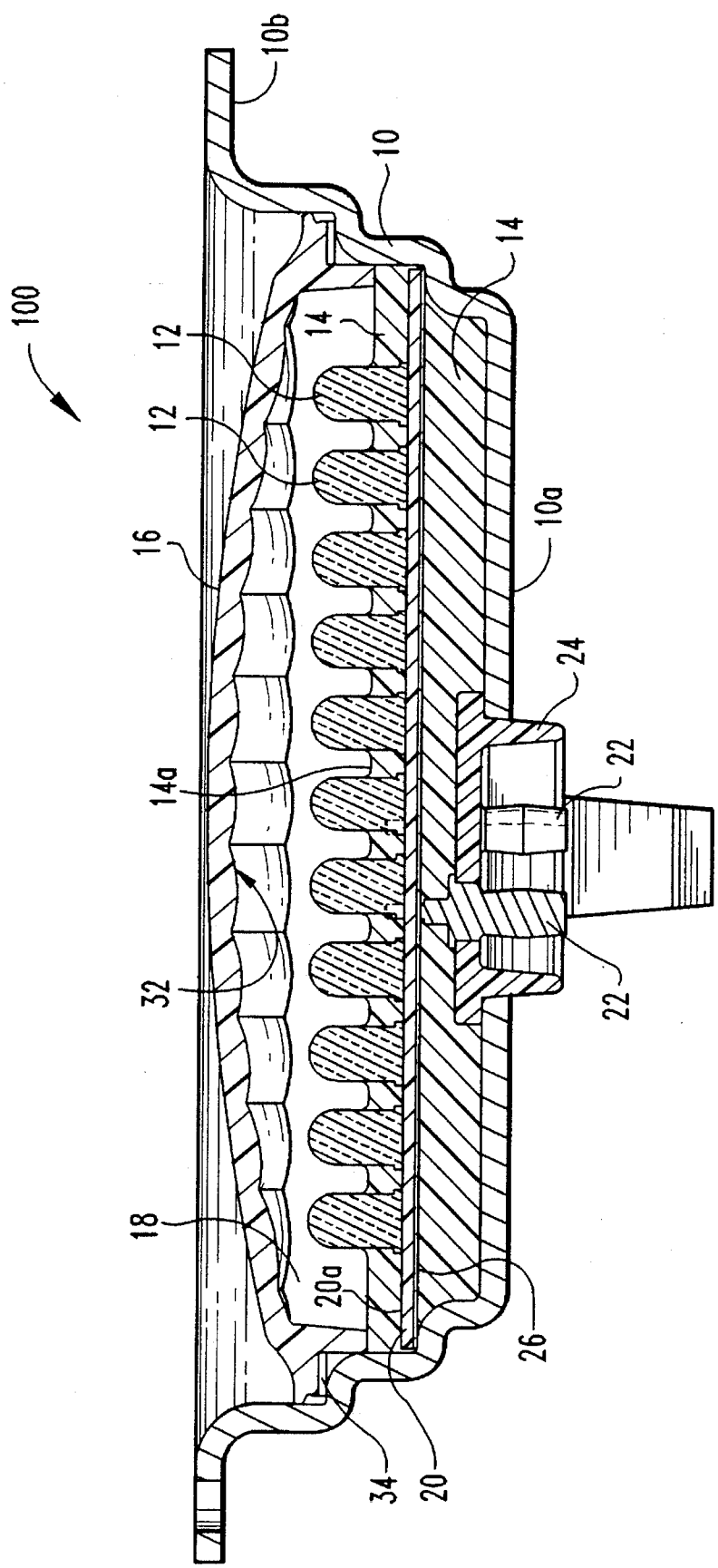
FIG. 2 is a side cross-sectional view taken along section line 2—2 of FIG. 1.

Referring to FIGS. 1 and 2, lamp assembly 100 includes housing 10 and light transmissive window or lens 16 which define a three dimensional space 18 therebetween. Housing 10 including flange portion 10b provides a recessed well to provide protection of the lens against breakage and to provide a sturdy and convenient mechanical mechanism to mount the lamp into a vehicle such as a tractor and/or a truck trailer. Within the space and secured to the housing is a circuit board 20 having light emitting units, preferably light emitting diodes (LEDs), 12 mounted on circuit board 20. Electrical power for the lamp is provided to the LEDs and circuit boards via electrical terminals or prongs 22. In the preferred embodiment, the electrical terminals 22 are three male protrusions arranged in a triangular configuration with respect to each other (see FIG. 3) within a circular recess of snap-in fitting 24. The snap-in fitting 24 is preferably made of plastic or other electrically insulating material and is snap fitted into housing 10. Terminals 22 are preferably soldered or otherwise connected to circuit board 20 providing a singular subassembly shown in FIG. 3 located in the space of the lamp. Upon snap fitting of this assembly into the housing, a liquid resin or other matrix is poured, injected, or otherwise placed into the housing to form a thermally conductive medium 14. Preferably, this medium is made of a formable matrix material, such as an epoxy resin, having a first coefficient of thermal conductivity (e.g., 1 to 1.5 BTU-IN/hr-ff$^2$-° F.) and is further made of a suspended material comprising heat conductive particles suspended in the matrix material. The particles have a second coefficient of thermal conductivity (e.g., about 80 BTU-IN/hr-ff$^2$-° F.) which is higher than the first coefficient of thermal conductivity, wherein the thermally conductive medium 14 conducts heat emitted from the light emitting units 12 out of lamp assembly 100. Preferably, the thermally conductive particles are metallic, ordinarily being made of alumina, aluminum or other particles suspended in the epoxy matrix. Such thermally conductive material 14 is commercially available as RESTECH 9695 offered by Restech Company of Commerce City, Colo., U.S.A. The overall thermal conductivity of medium 14 preferably, although not necessarily, not less than about 8 BTU-IN/hr-ff$^2$-°F. while maintaining an electrical resistivity of typically at least 5.6×1015 OHM-CM. Notably, thermally conductive medium 14 is preferably interstitially located between and in contact with most or all of the LEDs such as shown at 14a. This not only provides a greater heat sink and ability to withdraw thermal energy directly from the LEDs, but also provides a rigid and in situ custom formed buffer protecting the LEDs and the circuit board from vibration, fatigue, moisture and the like.

Figure 3:
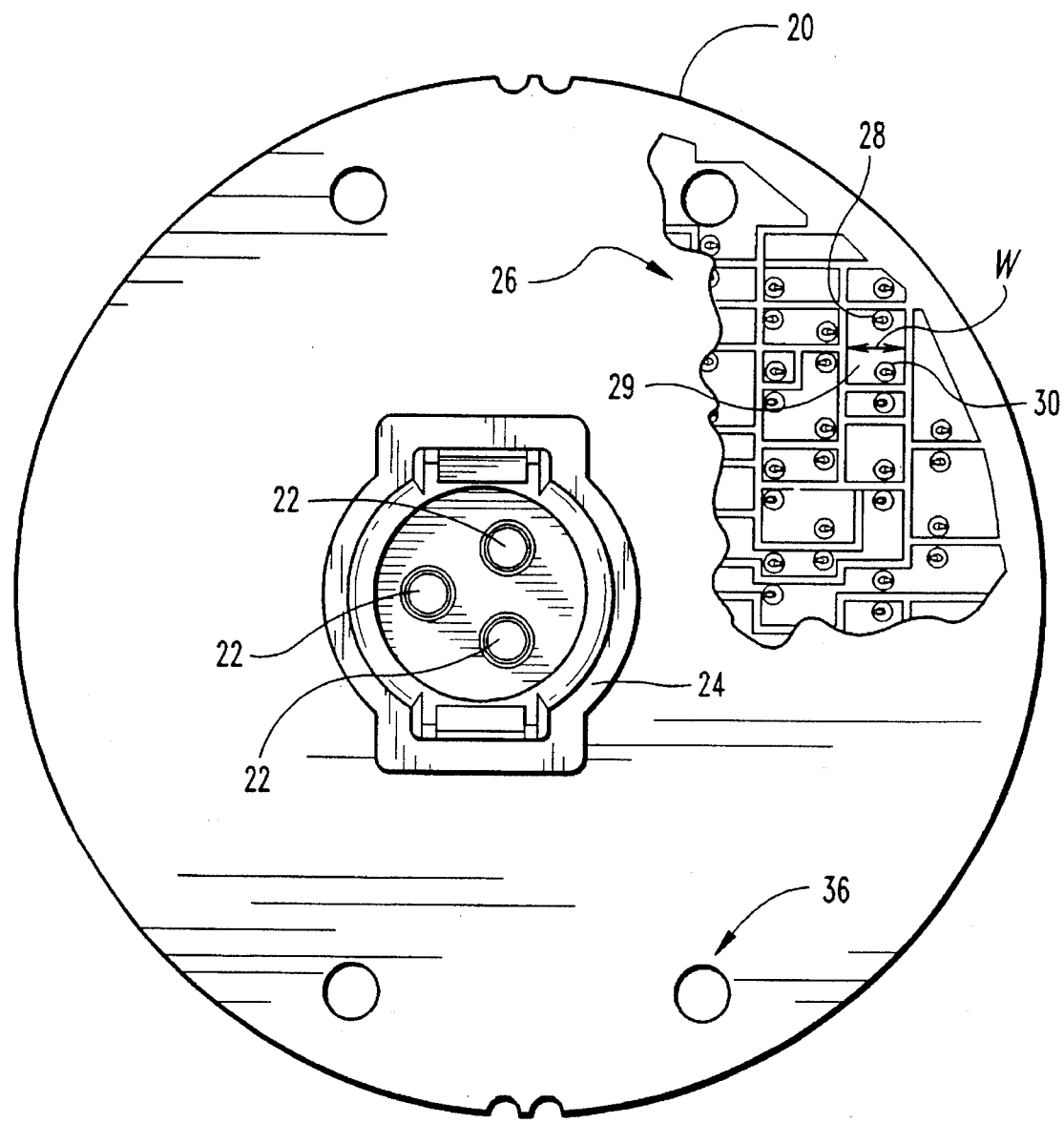
FIG. 3 is a rear view of the circuit board assembly used in the lamp of FIGS. 1 and 2 partially showing in the upper right hand comer the large copper traces which conduct heat from the cathode and anode of the LEDs.

Circuit board 20 is formed with a copper circuit pattern formed as layer 26 shown directly clad to the backside of circuit board 20. Circuit board 20 preferably is made of 1/16" NEMA grade FR-4 material with 2 oz. copper thickness (double sided) and is commercially available from W. L. Gore & Associates, Inc., of Phoenix, Ariz., U.S.A. A representative portion of the backside of circuit board 20 is shown in the upper right hand portion of FIG. 3 illustrating copper layer 26 comprising large copper traces, such as copper trace 29. It is to be understood that the circuit board of FIG. 3 has copper traces over substantially the entire back phase, preferably covering at least 85 percent of the back face of circuit board 20 and more preferably covering at least 90 percent of such surface area. The large copper traces, such as trace 29, have large widths such as width W (see FIG. 3) running between LEDs in a series. By having such large copper traces, the copper traces help act as a heat sink which conduct heat from the cathode 28 and the anode 30 of respective LEDs to provide a dedicated heat sink having a large surface area facing and in contact with thermally conductive medium 14 located between copper layer 26 and housing 10. In the preferred embodiment, housing 10 is made of metal, preferably aluminum, having good heat conductivity characteristics. As such, heat from the cathodes and anodes is transferred to the copper layer 26 in the form of copper traces directly into the thermally conductive medium 14. A fair amount of heat will also be generated by the body of the LEDs which, due to the "top" layer of medium 14 will also be transferred to the housing. Heat is transferred through the medium by conduction through the aluminum or other particulate matter. Since medium 14 is bonded directly to aluminum housing 10, preferably without any intermediate adhesives providing additional thermal boundaries, heat is conducted through housing 10 and shed to the outside environment. As such, the temperature of the LEDs and space 18 may be kept sufficiently cool to prevent degradation of the brightness of the lamp to meet the legal criteria set forth (e.g., FMVSS108) and incorporated herein and/or other criteria which may be established in terms of luminescence.

As shown in FIG. 1, the LEDs 12 are preferably arranged in a two-dimensional array having rows and columns, such as row R. Similarly, lens 16 is formed with a series of parallel lens ribs, such as lens rib 32 running parallel to row R and above the LEDs in row R. The lens ribs are shown in cross-sectional view FIG. 2, and cross-sectionally lens rib 32 is preferably convex formed in the arc of a circle so that along its longitudinal direction it forms a generally partial cylindrical shape. Since lens 16 is formed in a dome configuration, the cylindrical shape of the lens rib has a domed bow shape. As illustrated in the drawing figures, each of the rows of LEDs has a corresponding lens rib running parallel to it and over it with space 18 there in between. This lens rib configuration, as opposed to discrete lens for each LED, provide design flexibility and manufacturing savings for this type of light. Specifically, a particular light with a greater luminescence requirement may be made with a correspondingly higher density of LEDs spaced more closely together. In such redesign configuration, additional LEDs may be located in a given row without having to change the lens configuration of lens 16 since its lens rib feature will provide substantially constant optical characteristics along a given lens rib row. In the preferred embodiment, lens 16 is formed of a red tinted singularly molded piece of plastic with the lens ribs formed therein. It is to be understood that other lens rib configurations including separate lens rib elements, singular lens rib elements, non-spherical and/or non-convex arrangements may be used according to design requirements. Other tints or clear may beused for the lens which is light transmissive. Moreover, the lens ribs may, instead of being parallel and linear as shown, be arranged in parallel arcs and/or parallel annular (circular) tiers.

Figure 4:
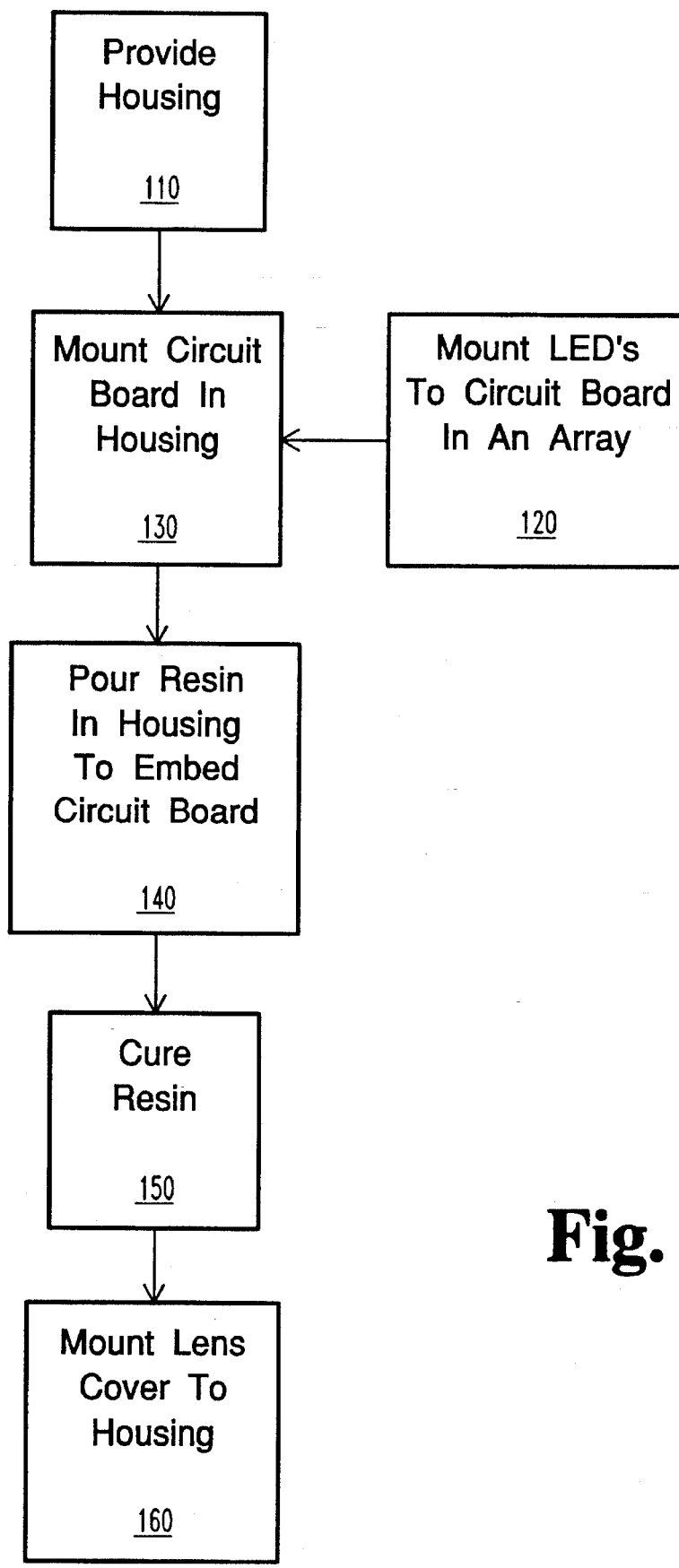
FIG. 4 is a flow chart of one method of manufacture of the present invention.

Housing 10 preferably is formed from a single piece of aluminum. As illustrated in FIG. 2, it forms a general cup shape for receiving the resin therein. The cup configuration has a bottom portion 10a and a parallel outer flange portion 10b with a series of annular stepped portion as illustrated for supporting circuit board 20 and lens 16. Preferably, a silicone or other seal 34 is provided between the lens and the housing with space 18 being substantially watertight. One method of making the present invention is diagramed in FIG. 4. The step 110 of providing a housing and the step 120 of mounting LEDs 12 to circuit board 20 in an array are followed by mounting the circuit board in the housing shown as 130. As mentioned earlier, such mounting in the preferred embodiment is accomplished by snapping fitting 24 into the bottom 10a of the housing with circuit board 20 resting circumferentially on the stepped shelf in the housing. The next step 140 is to pour liquid resin with the metallic particles suspended therein into the housing to embed the circuit board 20 in the resin. In the preferred embodiment, several openings 36 (see FIG. 3) are provided completely through circuit board 20 to allow liquid resin to flow through such openings and substantially completely fill the space between copper layer 26 of the circuit board and the bottom 10a of the housing. Moreover, a sufficient amount of resin is, in the preferred embodiment, provided to permit a layer of resin to be disposed on the front surface 20a of the circuit board 20 and interstitially between the LEDs. In an alternative embodiment, in some situations it may be acceptable and/or desirable not to provide such resin on the front surface 20a of the circuit board, but rather only along the back surface of the circuit board defined by copper layer 26. Also, while not preferred, the resin on the front surface may be separately formed without the heat conductive particles whereas the matrix on the back surface would have such particles embedded therein. The next step 150, is to cure the resin and thereafter the step 160 of mounting the lens cover 16 to the housing 10 is performed, preferably by snapping the lens cover to the housing and providing silicone sealing, as mentioned.

While the invention has been illustrated and described in detail in the drawings and foregoing description, the same is to be considered as illustrative and not restrictive in character, it being understood that only the preferred embodiment has been shown and described and that all changes and modifications that come within the spirit of the invention are desired to be protected.

What is claimed is:

1. A lamp assembly, comprising:

a housing defining an inner surface;

a light transmissive window member on said housing, wherein said housing inner surface and said window member form a space therebetween;

at least one light emitting unit mounted to a front face of a circuit board member located within said space, wherein said light emitting unit also emits heat; and, a formable thermally conductive medium located within said space, said medium including a formable matrix material having a first coefficient of thermal conductivity and a suspended material comprising heat conductive particles suspended in said matrix material, said particles having a second coefficient of thermal conductivity which is higher than said first coefficient of thermal conductivity, wherein said thermally conductive medium conducts heat emitted from the light emitting unit out of the lamp assembly; and, wherein said circuit board member is substantially fully embedded in said formable thermally conductive medium having said formable matrix material formed in contact with said light emitting unit and formed in contact with said circuit board member along said front face thereof and formed in contact with said circuit board member along said back face thereof and formed in contact with said inner surface of said housing.

2. The lamp assembly of claim 1 and further comprising:

a plurality of light emitting units located within said space which also emit heat, wherein said plurality of light emitting units comprise light emitting diodes.

3. The lamp assembly of claim 2 wherein said light emitting diodes are positioned in at least one row, said row being generally parallel with said light transmissive window member, and further comprising:

an elongated lens rib along said window member and running along and in front of said row of light emitting diodes, said lens rib having a generally circular curvature when viewed in cross-section and further having said curvature remain generally constant along at least portions of said lens rib in an elongated direction to allow selective positioning of said light emitting diodes at various locations along said elongated lens rib with substantially constant optics by said elongated lens rib.

4. The lamp assembly of claim 3 wherein said housing is made from a heat conductive metal formed as a cup to receive said formable matrix material.

5. The lamp assembly of claim 4 and further comprising a plurality of rows of light emitting diodes forming an array, and a plurality of generally parallel lens ribs positioned along said window member and respectively running along and in front of said rows of light emitting diodes.

6. The lamp assembly of claim 5 wherein said heat conductive particles comprise alumina particles.

7. The lamp assembly of claim 6 and further comprising an electrical coupling having three triangularly disposed male contacts projecting from a back side or said housing to provide electrical energy to power the lamp assembly.

8. The lamp assembly of claim 7 wherein a water-tight seal is formed between said housing and said window member, wherein said space therebetween is water-tight.

9. The lamp assembly of claim 1 and further comprising a plurality of rows of Light emitting diodes forming an array, and a plurality of generally parallel lens ribs positioned along said window member and respectively running along and in front of said rows of light emitting diodes.

10. The lamp assembly of claim 1 wherein said heat conductive particles comprise alumina particles.

11. The lamp assembly of claim 1 and further comprising an electrical coupling having three triangularly disposed male contacts projecting from a back side of said housing to provide electrical energy to power the lamp assembly.

12. The lamp assembly of claim 1 wherein said housing is made from a heat conductive metal.

13. The lamp assembly of claim 1 wherein a water-tight seal is formed between said housing and said window member, wherein said space therebetween is water-tight.

14. A lamp assembly, comprising:

a housing defining an inner surface having a bottom and side walls extending therefrom;

a light transmissive window member on said housing, wherein said housing inner surface and said window member form a space therebetween;

a row of light emitting units mounted to a carrier located within said space, said row being generally parallel with said light transmissive window member;

an elongated lens rib along said window member and running along and in front of said row of light emitting units, said lens rib having a generally circular curvature when viewed in cross-section and further having said curvature remain generally constant along at least portions of said lens rib to allow selective positioning of said light emitting units at various locations along said elongated lens rib with substantially constant optics by said elongated lens rib;

a formable thermal conductive medium including heat conductive particles encapsulated therein located within said space, wherein said carrier is at least partially embedded in said formable medium and said medium is bonded to said inner bottom surface of said housing.

15. The lamp assembly of claim 14 wherein said housing is made from a heat conductive metal.

16. The lamp assembly of claim 15 and further comprising a plurality of rows of light emitting diodes forming an array, and a plurality of generally parallel lens ribs positioned along said window member and respectively running along and in front of said rows of light emitting diodes.

17. The lamp assembly of claim 16 and further comprising an electrical coupling having three triangularly disposed male contacts projecting from a back side of said housing to provide electrical energy to power the lamp assembly.

18. The lamp assembly of claim 17 wherein a water-tight seal is formed between said housing and said window member, wherein said space therebetween is water-tight.

19. The lamp assembly of claim 14 and further comprising a plurality of rows of light emitting diodes forming an array, and a plurality of generally parallel lens ribs positioned along said window member and respectively running along and in front of said rows of light emitting diodes.

20. The lamp assembly of claim 14 and further comprising an electrical coupling having three triangularly disposed male contacts projecting from a back side of said housing to provide electrical energy to power the lamp assembly.

21. The lamp assembly of claim 14 wherein a water-tight seal is formed between said housing and said window member, wherein said space therebetween is water-tight.

22. A method for making a lamp assembly, comprising the steps of:

providing a housing;

positioning a circuit board having a plurality of light emitting diodes mounted thereto in said housing;

filling at least a portion of said housing with an initially fluid material in contact with said circuit board;

solidifying said initially fluid material into a solid material bonded to said housing and having said circuit board embedded therein, said solid material including heat conductive particles for conducting heat generated from said light emitting diodes away from said circuit board; and, placing a light transmissive window member onto said housing and over said light emitting diodes.

23. The method of claim 22 wherein said light emitting diodes are positioned in at least one row, said row being generally parallel with said light transmissive window member;

and wherein said light transmissive window further includes an elongated lens rib along said window member and running along and in front of said row of light emitting diodes, said lens rib having a generally circular curvature when viewed in cross-section and further having said curvature remain generally constant along at least portions of said lens rib in an elongated direction to allow selective positioning of said light emitting diodes at various locations along said elongated lens rib with substantially constant optics by said elongated lens rib.

24. The method of claim 22 wherein said housing is made from a heat conductive metal formed as a cup to receive said initially fluid material;

whereby heat generated from said light emitting diodes is conducted away from said circuit board by said solid material toward said heat conductive metal cup bonded thereto.

25. The lamp assembly of claim 14 wherein said formable medium is further bonded to at least a portion of said inner side wall surface of said housing.

* * * * *